United States Patent
Iga et al.

(10) Patent No.: US 12,354,916 B2
(45) Date of Patent: Jul. 8, 2025

(54) METHOD OF PROCESSING WAFER

(71) Applicant: DISCO CORPORATION, Tokyo (JP)

(72) Inventors: Hayato Iga, Tokyo (JP); Kazuya Hirata, Tokyo (JP); Shunichiro Hirosawa, Tokyo (JP)

(73) Assignee: DISCO CORPORATION, Tokyo (JP)

( * ) Notice: Subject to any disclaimer, the term of this patent is extended or adjusted under 35 U.S.C. 154(b) by 432 days.

(21) Appl. No.: 17/819,660

(22) Filed: Aug. 15, 2022

(65) Prior Publication Data
US 2023/0050807 A1 Feb. 16, 2023

(30) Foreign Application Priority Data

Aug. 16, 2021 (JP) .................. 2021-132212

(51) Int. Cl.
*H01L 21/78* (2006.01)
*H01L 21/268* (2006.01)
*H01L 21/304* (2006.01)

(52) U.S. Cl.
CPC ............ *H01L 21/78* (2013.01); *H01L 21/268* (2013.01); *H01L 21/304* (2013.01)

(58) Field of Classification Search
CPC ...... H01L 21/78; H01L 21/268; H01L 21/304
See application file for complete search history.

(56) References Cited

U.S. PATENT DOCUMENTS

2021/0121988 A1* 4/2021 Hirata ................ B23K 26/0823
2023/0005794 A1* 1/2023 Beyer ................ H01L 21/2236

FOREIGN PATENT DOCUMENTS

| JP | 2007158239 A | 6/2007 |
| JP | 2020-088012 A | 6/2020 |
| JP | 2020136442 A | 8/2020 |
| WO | 2021172085 A1 | 9/2021 |

* cited by examiner

*Primary Examiner* — Monica D Harrison
*Assistant Examiner* — Andre C Stevenson
(74) *Attorney, Agent, or Firm* — Greer Burns & Crain Ltd.

(57) ABSTRACT

A first peel-off layer extending along a side surface of a truncated cone that has a first bottom surface positioned near a face side of a wafer and a second bottom surface positioned within the wafer and smaller in diameter than the first bottom surface, and a second peel-off layer extending along the second bottom surface of the truncated cone are formed in the wafer. Then, external forces are exerted on the wafer thicknesswise of the wafer, thereby dividing the wafer along the first peel-off layer and the second peel-off layer that function as division initiating points.

4 Claims, 8 Drawing Sheets

METHOD OF PROCESSING WAFER

BACKGROUND OF THE INVENTION

Field of the Invention

The present invention relates to a method of processing a wafer.

Description of the Related Art

Chips of semiconductor devices, hereinafter referred to simply as "devices," are generally fabricated from disk-shaped wafers made of a semiconductor material such as silicon (Si). Specifically, a disk-shaped wafer has a plurality of areas demarcated by a grid of projected dicing lines and a plurality of devices formed on a face side of the respective areas. The wafer is divided along the projected dicing lines into chips.

Some wafers have through-silicon vias (TSVs) for the purpose of, for example, producing highly integrated packages including a plurality of chips. Such packages allow electrodes included in different chips to be electrically interconnected through TSVs, for example.

A TSV is formed in a wafer according to the following sequence of steps. First, a groove is formed on a face side of a wafer. Then, a TSV is provided in the groove. Then, the face side of the wafer is affixed to a support wafer. Then, a reverse side of the wafer is ground until the TSV is exposed on the reverse side.

A wafer often has its outer circumferential region beveled for the purpose of preventing itself from chipping. When the reverse side of the wafer with the beveled outer circumferential region is ground until the thickness of the wafer is reduced to half or less, the reverse side of the outer circumferential region is shaped into something like a knife edge.

While the reverses side of the wafer is being ground in this manner, stresses tend to concentrate on the reverse side of the outer circumferential region, making the wafer likely to crack. As a result, the yield of chips from the wafer is liable to decrease. To avoid such problems, it has been proposed in the art to remove part of the face side of the outer circumferential region of the wafer, i.e., to perform what is generally called edge trimming, before the reverse side of the wafer is ground (see, for example, Japanese Patent Laid-open No. 2007-158239).

At the time the remainder of the reverse side of the wafer has been ground, the wafer has its outer circumferential side face extending generally perpendicularly to the face and reverse sides of the wafer. Consequently, no stress concentration occurs on the reverse side of the outer circumferential region during the grinding of the wafer, making the wafer less likely to crack. As a consequence, the yield of chips from the wafer is prevented from decreasing.

However, in a case where the reverse side of the wafer is ground until TSVs are exposed on the reverse side of the wafer after the edge trimming, the amount of material ground off from the wafer is large, and hence, grindstones that are used to grind the wafer are worn to a large extent. Accordingly, chips or packages fabricated from the wafer are likely to become costly, and the processing of the wafer is apt to be prolonged.

In view of the foregoing shortcomings, it has been proposed in the art to divide a wafer with a laser beam having a wavelength transmittable through the wafer (see, for example, Japanese Patent Laid-open No. 2020-136442). According to the proposed process, the laser beam is applied in an annular pattern to a region of the wafer that causes no irregular reflection of the laser beam, i.e., a region positioned radially inwardly of the beveled outer circumferential region, while the focused spot of the laser beam is being positioned on the face side of the wafer.

The applied laser beam forms in the wafer a peel-off layer extending along a side surface of a cylinder, i.e., a peel-off layer shaped as a hollow cylinder, the cylinder having a bottom surface positioned on the face side of the wafer and an upper surface positioned in the wafer. Then, the laser beam is applied again to a region of the wafer that is positioned radially inwardly of the peel-off layer while the focused spot of the laser beam is being positioned on an upper surface of the cylinder. The applied laser beam forms a peel-off layer along the upper surface of the cylinder, i.e., a peel-off layer shaped as a disk.

Then, external forces are exerted on the wafer to divide the wafer along the peel-off layer shaped as the hollow cylinder and the peel-off layer shaped as the disk. In other words, the outer circumferential region of the wafer is separated from a region of the wafer where devices are formed, i.e., a device region, and a reverse side of the device region is separated from a face side of the device region.

In a case where the wafer is divided in the manner described above, the amount of material ground off from the reverse side of the wafer until TSVs are exposed is reduced, and grindstones that are used to grind the wafer are worn to a reduced extent. Consequently, chips or packages fabricated from the wafer are prevented from becoming costly, and the processing of the wafer prevented from being prolonged.

SUMMARY OF THE INVENTION

For dividing the wafer along the peel-off layer shaped as the hollow cylinder and the peel-off layer shaped as the disk as described above, it is necessary to separate the outer circumferential region of the wafer from the device region radially of the wafer and also to separate the reverse side of the device region from the face side thereof thicknesswise of the wafer.

The direction of external forces exerted to separate the outer circumferential region of the wafer from the device region and the direction of external forces exerted to separate the reverse side of the device region from the face side thereof are perpendicular to each other. Therefore, it is not necessarily easy to divide the wafer simultaneously along the peel-off layer shaped as the hollow cylinder and the peel-off layer shaped as the disk by exerting external forces in particular directions to the wafer.

For example, in a case where the wafer is divided by exerting external forces to the wafer thicknesswise of the wafer, a side surface of the device region that is newly exposed by dividing the wafer along the peel-off layer shaped as the hollow cylinder and an inner side surface of the outer circumferential region of the wafer tend to contact each other. In this case, cracks may be developed toward devices formed on the face side of the device region, possibly damaging the devices.

As described above, the peel-off layer shaped as the hollow cylinder is formed in the region of the wafer that causes no irregular reflection of the laser beam, i.e., the region positioned radially inwardly of the beveled outer circumferential region. Therefore, in a case where the wafer is divided along the peel-off layer shaped as the hollow cylinder, a region in the vicinity of an inner side of the outer circumferential region of the wafer cannot be used in the fabrication of chips of devices, possibly resulting in a reduction in the number of chips that can be manufactured from the wafer.

In view of the above-described drawbacks, it is an object of the present invention to provide a method of processing a wafer to prevent devices formed on the wafer from being broken at the time the separation of an outer circumferential region of the wafer from a device region thereof and the separation of a reverse side of the device region from a face side thereof are simultaneously carried out and also to prevent the number of chips that can be manufactured from the wafer from being reduced.

In accordance with an aspect of the present invention, there is provided a method of processing a first wafer having a plurality of devices formed on a face side thereof and a beveled outer circumferential region, by applying a laser beam having a wavelength transmittable through the first wafer to the first wafer to form a peel-off layer in the first wafer and thereafter dividing the first wafer along the peel-off layer that functions as a division initiating point. The method including an affixing step of affixing the face side of the first wafer to a face side of a second wafer, a first peel-off layer forming step of applying the laser beam to a region of the first wafer that is positioned radially inwardly of the outer circumferential region of the first wafer, in such a manner that a focused spot of the laser beam is progressively closer to the face side of the first wafer as the focused spot is progressively closer to the outer circumferential region, thereby forming a first peel-off layer in the first wafer that extends along a side surface of a truncated cone having a first bottom surface positioned near the face side of the first wafer and a second bottom surface positioned within the first wafer and smaller in diameter than the first bottom surface, a second peel-off layer forming step of applying the laser beam to a region of the first wafer that is positioned radially inwardly of the first peel-off layer while the focused spot of the laser beam is being positioned on the second bottom surface of the truncated cone, thereby forming a second peel-off layer in the first wafer that extends along the second bottom surface of the truncated cone, and a dividing step of, after the affixing step, the first peel-off layer forming step, and the second peel-off layer forming step, exerting external forces on the first wafer thicknesswise of the first wafer to divide the first wafer along the first peel-off layer and the second peel-off layer that function as division initiating points.

Preferably, the first peel-off layer forming step is carried out before the second peel-off layer forming step.

Preferably, the laser beam is branched in the first peel-off layer forming step so as to form a plurality of focused spots arrayed radially of the first wafer as viewed in plan.

According to the present invention, the first peel-off layer extending along the side surface of the truncated cone that has the first bottom surface positioned near the face side of the wafer and the second bottom surface positioned within the wafer and smaller in diameter than the first bottom surface, and the second peel-off layer extending along the second bottom surface of the truncated cone are formed in the wafer. Then, external forces are exerted on the wafer thicknesswise of the wafer, thereby dividing the wafer along the first peel-off layer and the second peel-off layer that function as division initiating points.

In the wafer, the first peel-off layer is formed along the side surface of the truncated cone. When the wafer is divided, the probability that a side surface of a region where the devices are formed, i.e., a device region, that is newly exposed by dividing the wafer along the first peel-off layer and an inner side surface of the outer circumferential region of the wafer will contact each other is low. According to the present invention, therefore, the probability that cracks will be developed toward the devices formed on the face side of the device region is also low, preventing the devices from being damaged.

In the wafer, furthermore, cracks tend to be developed in directions from the first peel-off layer along the side surface of the truncated cone. In this case, the probability that cracks will be developed toward the devices formed on the face side of the device region is low. According to the present invention, therefore, the number of chips that can be fabricated from the wafer is prevented from being reduced.

The above and other objects, features and advantages of the present invention and the manner of realizing them will become more apparent, and the invention itself will best be understood from a study of the following description and appended claims with reference to the attached drawings showing a preferred embodiment of the invention.

DETAILED DESCRIPTION OF THE PREFERRED EMBODIMENT

Figure 1A:
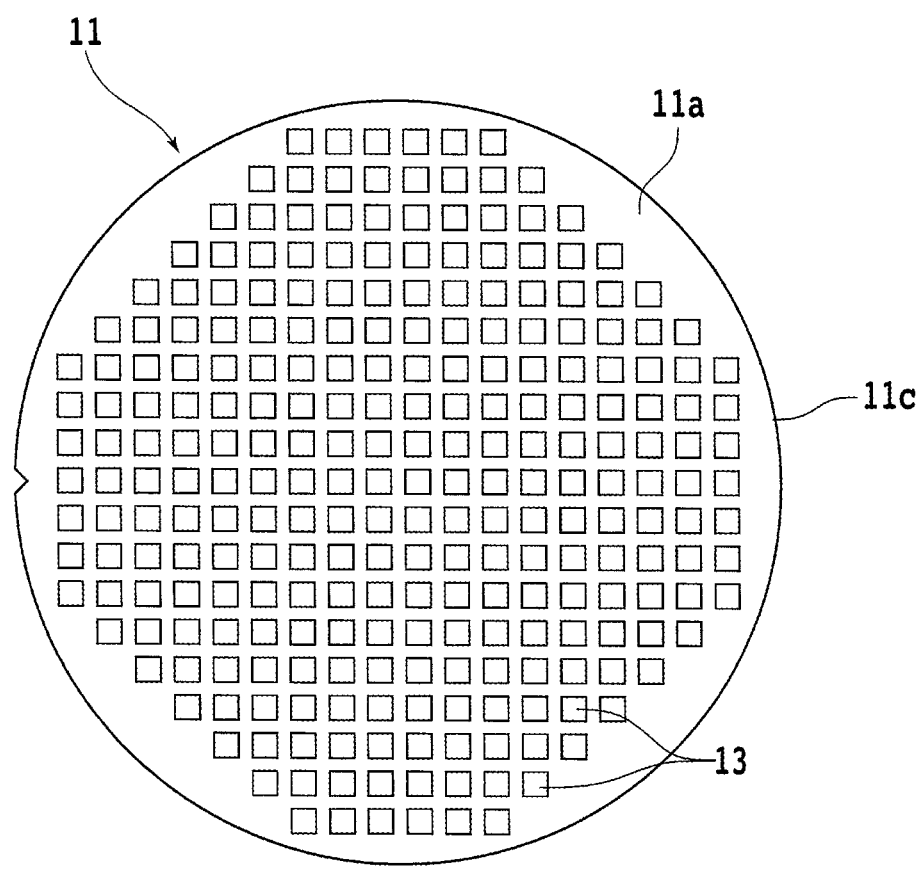
FIG. 1A is a plan view schematically illustrating a wafer by way of example.
Figure 1B:
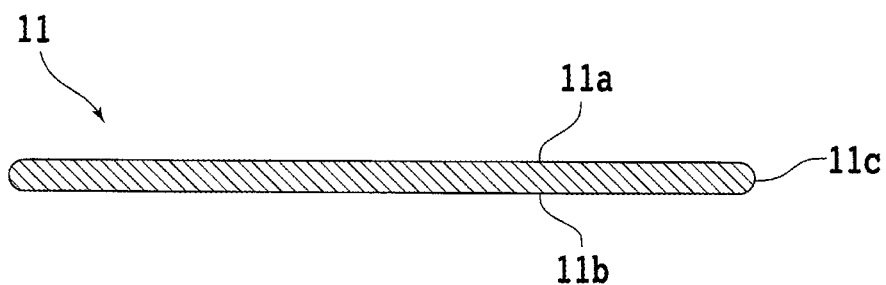
FIG. 1B is a cross-sectional view of the wafer illustrated in FIG. 1A.

A preferred embodiment of the present invention will be described below with reference to the accompanying drawings. FIG. 1A schematically illustrates in plan a wafer by way of example, and FIG. 1B illustrates in cross section the wafer illustrated in FIG. 1A. The wafer 11 illustrated in FIGS. 1A and 1B is made of silicon, for example, and has a face side 11a and a reverse side 11b that lie generally parallel to each other.

The wafer 11 includes a plurality of areas demarcated by a plurality of intersecting projected dicing lines. Devices 13 such as integrated circuits (ICs), large-scale-integration (LSI) circuits, semiconductor memories, or complementarymetal-oxide-semiconductor (CMOS) image sensors are formed on the face side 11a in the respective areas.

Furthermore, grooves where TSVs are to be provided may be formed on the face side 11a of the wafer 11. The wafer 11 that is disk-shaped, for example, has a beveled outer circumferential region. In other words, the wafer 11 has an outer circumferential side face 11c that is curved in such a manner as to protrude outwardly. The outer circumferential region of the wafer 11 is free of devices 13. A region of the wafer 11 where the devices 13 are formed, i.e., a device region, is disposed radially inwardly of and surrounded by the outer circumferential region.

The wafer 11 is not limited to any particular materials, shapes, structures, sizes, etc. The wafer 11 may be made of any of various semiconductor materials, e.g., silicon carbide (SiC) or gallium nitride (GaN), other than silicon. Similarly, the devices 13 are not limited to any particular kinds, numbers, shapes, structures, sizes, layouts, etc.

Figure 2:
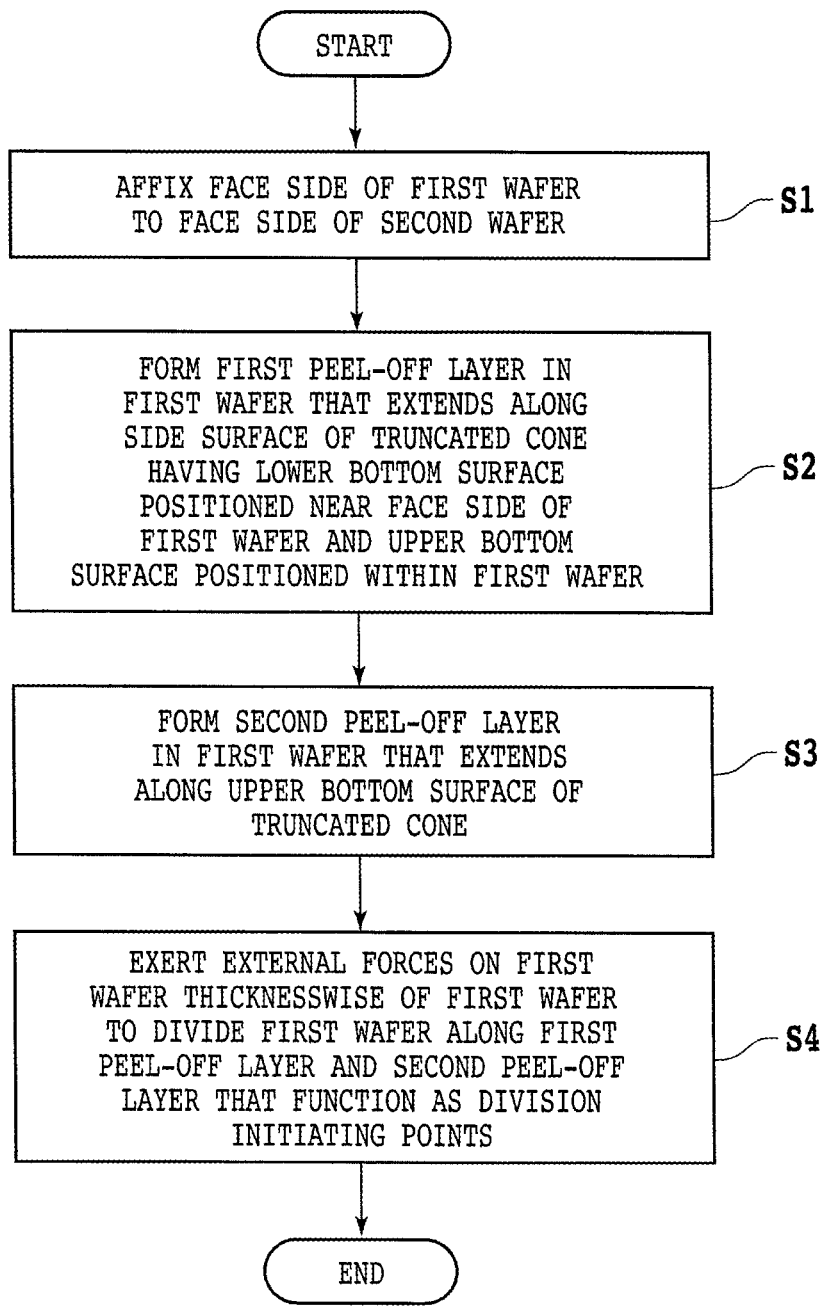
FIG. 2 is a flowchart of a sequence of a method of processing a wafer according to an embodiment of the present invention.

FIG. 2 is a flowchart of a sequence of a method of processing a wafer according to the present embodiment. According to the method, a laser beam having a wavelength transmittable through the wafer 11 is applied to the wafer 11, forming peel-off layers in the wafer 11, and then the wafer 11 is divided along the peel-off layers that function as division initiating points.

Figure 3:
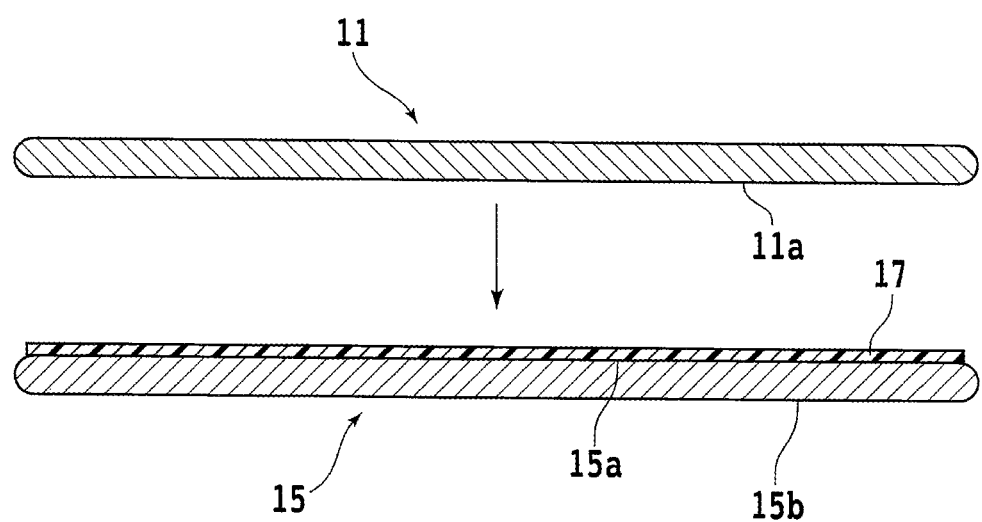
FIG. 3 is a cross-sectional view schematically illustrating a manner in which a face side of the wafer is affixed to a face side of a support wafer.

Specifically, according to the method, the face side 11a of the wafer 11, i.e., a first wafer, is affixed to a face side of a support wafer, i.e., a second wafer (affixing step S1). FIG. 3 schematically illustrates in cross section the manner in which the face side 11a of the wafer 11 is affixed to a face side 15a of the support wafer, denoted by 15.

The support wafer 15 to which the wafer 11 is to be affixed is of the same shape as the wafer 11, for example. As with the wafer 11, the support wafer 15 may have a plurality of devices formed on the face side 15a thereof. An adhesive 17 such as an acryl adhesive or an epoxy adhesive, for example, is disposed on the face side 15a of the support wafer 15.

In the affixing step S1, while a reverse side 15b of the support wafer 15 is being supported, the face side 11a of the wafer 11 is pressed against the face side 15a of the support wafer 15 through the adhesive 17 interposed therebetween. The face side 11a of the wafer 11 is thus affixed to the face side 15a of the support wafer 15, making up a laminated wafer.

Then, a peel-off layer, i.e., a first peel-off layer, is formed in the wafer 11 in such a manner as to extend along a side surface of a truncated cone that has a first bottom surface, i.e., a lower bottom surface, positioned near the face side 11a of the wafer 11 and a second bottom surface, i.e., an upper bottom surface, positioned within the wafer 11 and smaller in diameter than the first bottom surface (first peel-off layer forming step S2). Thereafter, a peel-off layer, i.e., a second peel-off layer, is formed in the wafer 11 in such a manner as to extend along the upper bottom surface of the truncated cone (second peel-off layer forming step S3).

Figure 4:
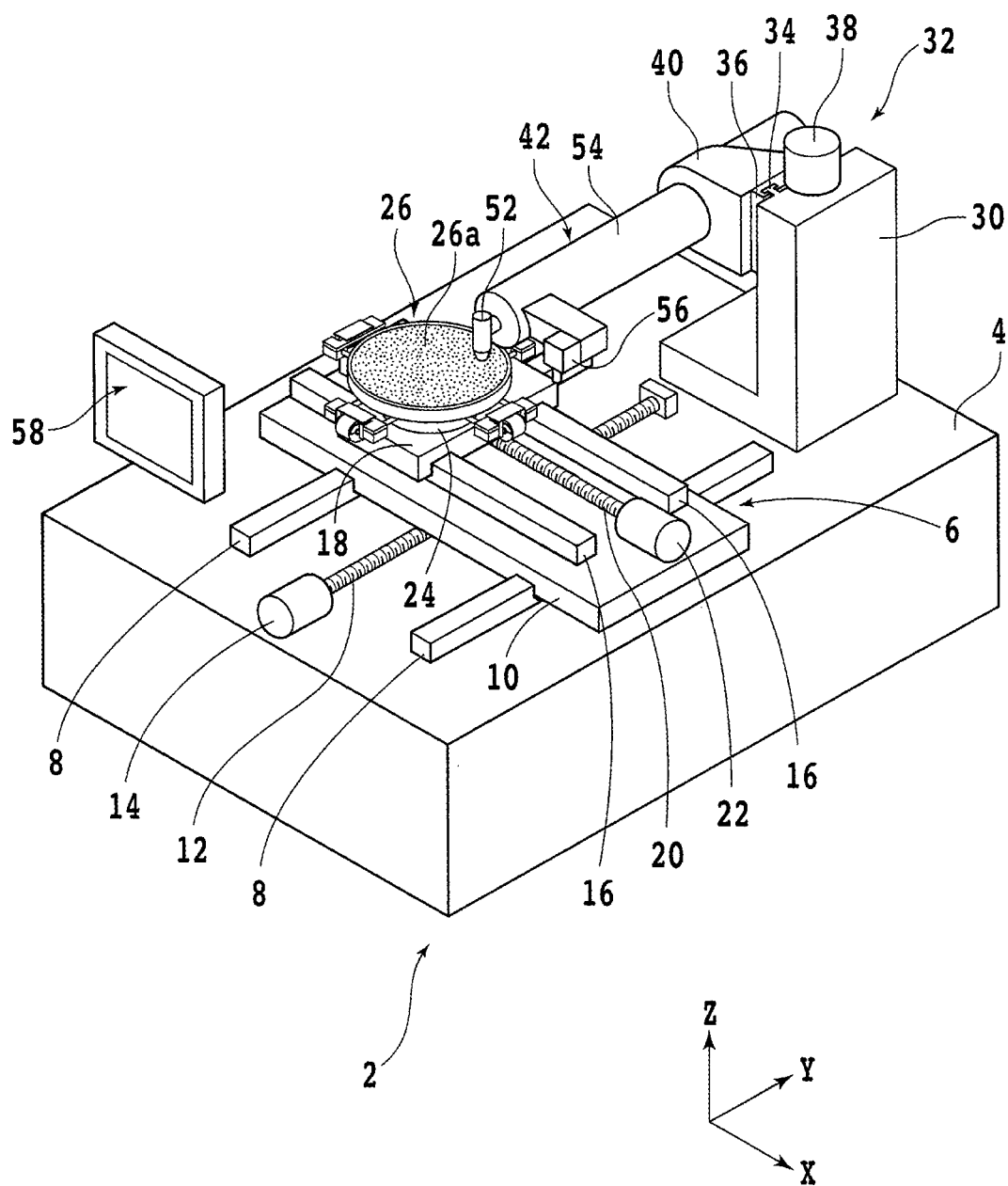
FIG. 4 is a perspective view schematically illustrating by way of example a laser processing apparatus that is used in a first peel-off layer forming step and a second peel-off layer forming step.

FIG. 4 schematically illustrates by way of example in perspective a laser processing apparatus 2 that is used in the first peel-off layer forming step S2 and the second peel-off layer forming step S3. In FIG. 4, X-axis directions, or leftward and rightward directions, indicated by an arrow X and Y-axis directions, or forward and rearward directions, indicated by an arrow Y extend perpendicularly to each other in a horizontal plane, and Z-axis directions, or upward and downward directions, indicated by an arrow Z extend vertically perpendicularly to the X-axis directions and the Y-axis directions.

As illustrated in FIG. 4, the laser processing apparatus 2 has a base 4 that supports various components thereof. A horizontal moving mechanism 6 is disposed on an upper surface of the base 4. The horizontal moving mechanism 6 has a pair of Y-axis guide rails 8 fixed to the upper surface of the base 4 and extending along the Y-axis directions.

The horizontal moving mechanism 6 also includes a Y-axis movable plate 10 slidably mounted on the Y-axis guide rails 8 for sliding movement therealong. A screw shaft 12 extending along the Y-axis directions is disposed between the Y-axis guide rails 8. An electric motor 14 is coupled to an end, i.e., a front end, of the screw shaft 12 for rotating the screw shaft 12 about its central axis.

A nut, not illustrated, that contains a number of balls rollingly movable in a helical groove defined in an outer surface of the screw shaft 12 is operatively threaded over the screw shaft 12, thereby a ball screw is constructed. When the electric motor 14 is energized to rotate the screw shaft 12 about its central axis, the balls roll in the helical groove and circulate through the nut, causing the nut to move along one of the Y-axis directions at a time.

The nut is fixed to a lower surface of the Y-axis movable plate 10. Therefore, when the screw shaft 12 is rotated about its central axis by the electric motor 14, the nut and the Y-axis movable plate 10 are moved along one of the Y-axis directions at a time. A pair of X-axis guide rails 16 are fixed to an upper surface of the Y-axis movable plate 10 and extend along the X-axis directions.

An X-axis movable plate 18 is slidably mounted on the X-axis guide rails 16 for sliding movement therealong. A screw shaft 20 extending along the X-axis directions is disposed between the X-axis guide rails 16. An electric motor 22 is coupled to an end of the screw shaft 20 for rotating the screw shaft 20 about its central axis.

A nut, not illustrated, that contains a number of balls rollingly movable in a helical groove defined in an outer surface of the screw shaft 20 is operatively threaded over the screw shaft 20, thereby a ball screw is constructed. When the electric motor 22 is energized to rotate the screw shaft 20 about its central axis, the balls roll in the helical groove and circulate through the nut, causing the nut to move along one of the X-axis directions at a time.

The nut is fixed to a lower surface of the X-axis movable plate 18. Therefore, when the screw shaft 20 is rotated about its central axis by the electric motor 22, the nut and the X-axis movable plate 18 are moved along one of the X-axis directions at a time.

A cylindrical table base 24 is disposed on an upper surface of the X-axis movable plate 18. A holding table 26 for holding thereon the laminated wafer referred to above is mounted on an upper portion of the table base 24. The holding table 26 has a circular upper surface as a holding surface lying parallel to the X-axis directions and the Y-axis directions, for example. A porous plate 26a is exposed on this holding surface.

The table base 24 has a lower portion coupled to a rotary actuator, not illustrated, such as an electric motor. When the rotary actuator is energized, it rotates the holding table 26 about its central axis. The central axis of the holding table 26 is a straight line through the center of the holding surface and parallel to the Z-axis directions. When the horizontal moving mechanism 6 is actuated, the holding table 26 is moved along the X-axis directions and/or the Y-axis directions.

The porous plate 26a communicates with a suction source, not illustrated, such as a vacuum pump through a fluid channel, not illustrated, defined in the holding table 26.

When the suction source is actuated, it generates a negative pressure that is transmitted through the fluid channel to a space near the holding surface.

A support structure 30 having a side surface generally parallel to the Y-axis directions and the Z-axis directions is disposed on a rear area of the base 4 behind the horizontal moving mechanism 6. A vertical moving mechanism 32 is disposed on the side surface of the support structure 30. The vertical moving mechanism 32 has a pair of Z-axis guide rails 34 fixed to the side surface of the support structure 30 and extending along the Z-axis directions.

The vertical moving mechanism 32 also includes a Z-axis movable plate 36 slidably mounted on the Z-axis guide rails 34 for sliding movement therealong. A screw shaft, not illustrated, extending along the Z-axis directions is disposed between the Z-axis guide rails 34. An electric motor 38 is coupled to an end, i.e., an upper end, of the screw shaft for rotating the screw shaft about its central axis.

A nut, not illustrated, that contains a number of balls rollingly movable in a helical groove defined in an outer surface of the screw shaft is operatively threaded over the screw shaft, thereby a ball screw is constructed. When the electric motor 38 is energized to rotate the screw shaft about its central axis, the balls roll in the helical groove and circulate through the nut, causing the nut to move along one of the Z-axis directions at a time.

The nut is fixed to a reverse side of the Z-axis movable plate 36. Therefore, when the screw shaft is rotated about its central axis by the electric motor 38, the nut and the Z-axis movable plate 36 are moved along one of the Z-axis directions at a time.

Figure 5:
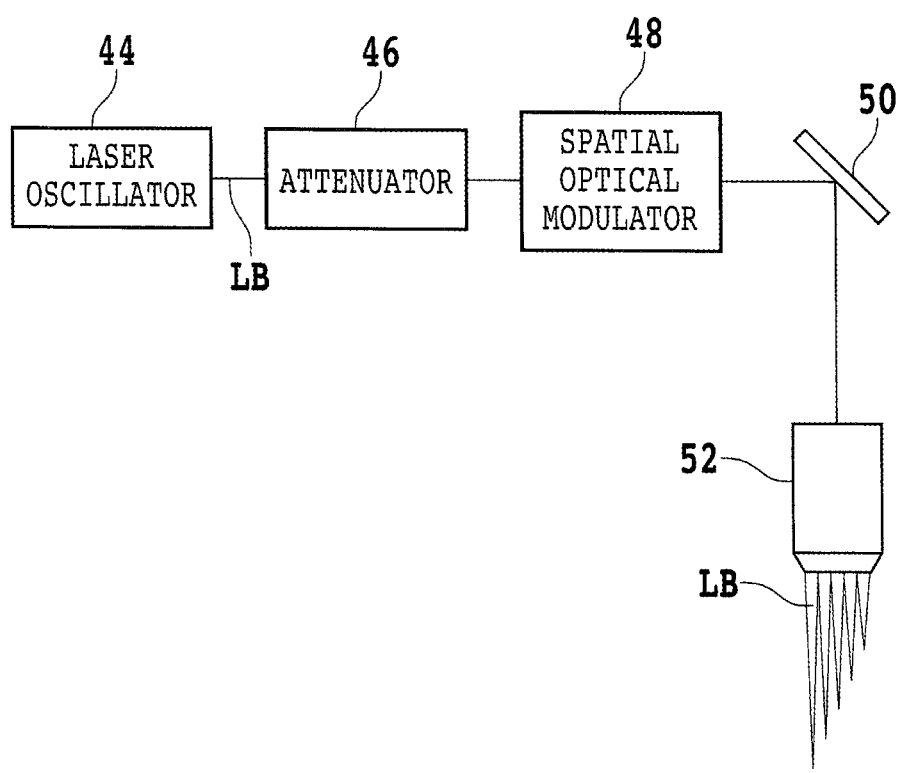
FIG. 5 is a view schematically illustrating a manner in which a laser beam emitted from a laser beam applying unit travels.

A support block 40 is fixed to a face side of the Z-axis movable plate 36. The support block 40 supports a portion of a laser beam applying unit 42. FIG. 5 schematically illustrates a manner in which a laser beam LB emitted from the laser beam applying unit 42 travels. Some of the components of the laser beam applying unit 42 are illustrated as functional blocks.

The laser beam applying unit 42 has a laser oscillator 44 mounted on the base 4. The laser oscillator 44 has Nd:YAG or the like as a laser medium and emits the laser beam LB that has a wavelength of 1342 nm, for example, transmittable through the wafer 11. The laser beam LB is a pulsed laser beam having a frequency of 60 kHz, for example.

The laser beam LB emitted from the laser oscillator 44 has its output power level adjusted by an attenuator 46 and is then supplied to a spatial optical modulator 48. The laser beam LB is branched in the spatial optical modulator 48. Specifically, the spatial optical modulator 48 branches the laser beam LB so as to form a plurality of focused spots positioned in the wafer 11 at different positions, i.e., coordinates, in a plane parallel to the X-axis directions and the Y-axis directions, i.e., an XY coordinate plane, and at different positions, i.e., heights, in the Z-axis directions, for example.

The laser beam LB emitted from the spatial optical modulator 48 is applied to and reflected by a mirror 50 to travel to the applying head 52. The applying head 52 houses therein a condensing lens, not illustrated, for converging the laser beam LB. The laser beam LB converged by the condensing lens is emitted toward the holding surface of the holding table 26.

As illustrated in FIG. 4, the applying head 52 is mounted on a front end of a cylindrical housing 54. The support block 40 is fixed to a rear side surface of the housing 54. An image capturing unit 56 is fixed to a front side surface of the housing 54.

The image capturing unit 56 includes, for example, a light source such as a light-emitting diode (LED), an objective lens, and an image capturing device such as a charged-coupled device (CCD) image sensor or a CMOS image sensor.

When the vertical moving mechanism 32 is actuated, the laser beam applying unit 42 and the image capturing unit 56 are moved along one of the Z-axis directions at a time. The components referred to above of the laser processing apparatus 2 are enclosed in a cover, not illustrated, mounted on the base 4. A touch panel 58 is disposed on a front surface of the cover.

The touch panel 58 includes an input device such as an electrostatic-capacitance or resistive-film touch sensor and a display device such as a liquid crystal display or an organic electroluminescence (EL) display. The touch panel 58 functions as a user interface.

The laser processing apparatus 2 carries out the first peel-off layer forming step S2 and the second peel-off layer forming step S3 according to the following sequence, for example. First, the laminated wafer is placed on the holding table 26 in such a manner that the center of the reverse side 15b of the support wafer 15 of the laminated wafer and the center of the holding surface of the holding table 26 are aligned with each other.

Then, the suction source communicated with the porous plate 26a is actuated to hold the laminated wafer under suction on the holding table 26. Next, the image capturing unit 56 captures an image of the reverse side 11b of the wafer 11 of the laminated wafer.

Then, on the basis of the captured image, the horizontal moving mechanism 6 is actuated to position the applying head 52 of the laser beam applying unit 42 directly above a region of the wafer 11 slightly radially inwardly of the outer circumferential region thereof.

Thereafter, the laser beam applying unit 42 is energized to apply the branched laser beam LB from the applying head 52 to the wafer 11 in such a manner that the focused spots of the laser beam LB are positioned in the wafer 11 so as to be progressively closer to the face side 11a of the wafer 11 as they are progressively closer to the outer circumferential region of the wafer 11.

Figure 6:
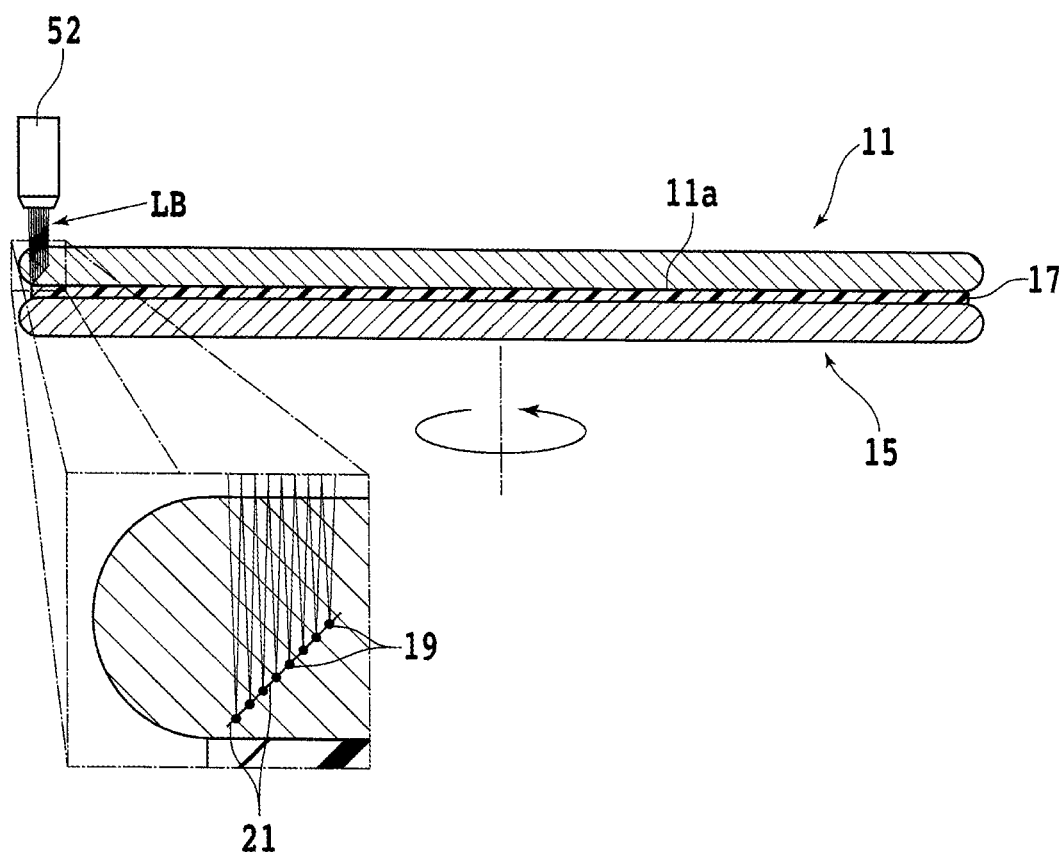
FIG. 6 is a cross-sectional view schematically illustrating a manner in which laser beam is applied to a region of the wafer that is positioned radially inwardly of an outer circumferential region thereof.

FIG. 6 schematically illustrates in cross section the manner in which the laser beam LB is applied to the region of the wafer 11 that is positioned radially inwardly of the outer circumferential region thereof. In FIG. 6, the laser beam LB forms a plurality of, e.g., eight, focused spots that are spaced at intervals of 10 μm in the wafer 11 in each of radial directions thereof, i.e., directions perpendicular to the Z-axis directions, and thicknesswise directions thereof, i.e., directions along the Z-axis directions, for example.

The laser beam LB thus applied develops modified areas 19 around the respective focused spots in the wafer 11 where a crystal structure of the material of the wafer 11 is disrupted. The modified areas 19 are arranged in a straight array radially of the wafer 11 as viewed in plan. The straight array of the modified areas 19 is inclined to the face side 11a of the wafer 11 at an acute angle of 45°.

The angle formed between the straight array of the modified areas 19 and the face side 11a of the wafer 11 is not limited to 45°. Stated otherwise, the laser beam LB may be applied to the wafer 11 in such a manner that they develop their respective focused spots in the wafer 11 that are spaced at intervals in radial directions thereof and at intervals in thicknesswise directions thereof, the intervals in the radial directions being different from the intervals in the thicknesswise directions.

Cracks 21 extend from each of the modified areas 19 in such a manner as to interconnect adjacent modified areas 19 in each pair. The modified areas 19 and the cracks 21 extending from each of the modified areas 19 jointly form a peel-off layer in the wafer 11.

Then, while the laser beam applying unit 42 is being energized, the rotary actuator coupled to the lower portion of the table base 24 is operated to rotate the holding table 26 that is holding the laminated wafer thereon by at least one revolution.

As a result, a peel-off layer, i.e., a first peel-off layer, is formed in the region of the wafer 11 that is positioned slightly radially inwardly of the outer circumferential region thereof, the first peel-off layer extending along a side surface of a truncated cone that has a lower bottom surface positioned near the face side 11a of the wafer 11 and an upper bottom surface positioned within the wafer 11.

Thereafter, the horizontal moving mechanism 6 is actuated to position the applying head 52 of the laser beam applying unit 42 directly above a region of the wafer 11 slightly radially inwardly of the first peel-off layer. Then, the laser beam applying unit 42 is energized to apply branched laser beam LB to the wafer 11 in such a manner that all the focused spots thereof will be positioned on the upper bottom surface of the truncated cone.

Figure 7:
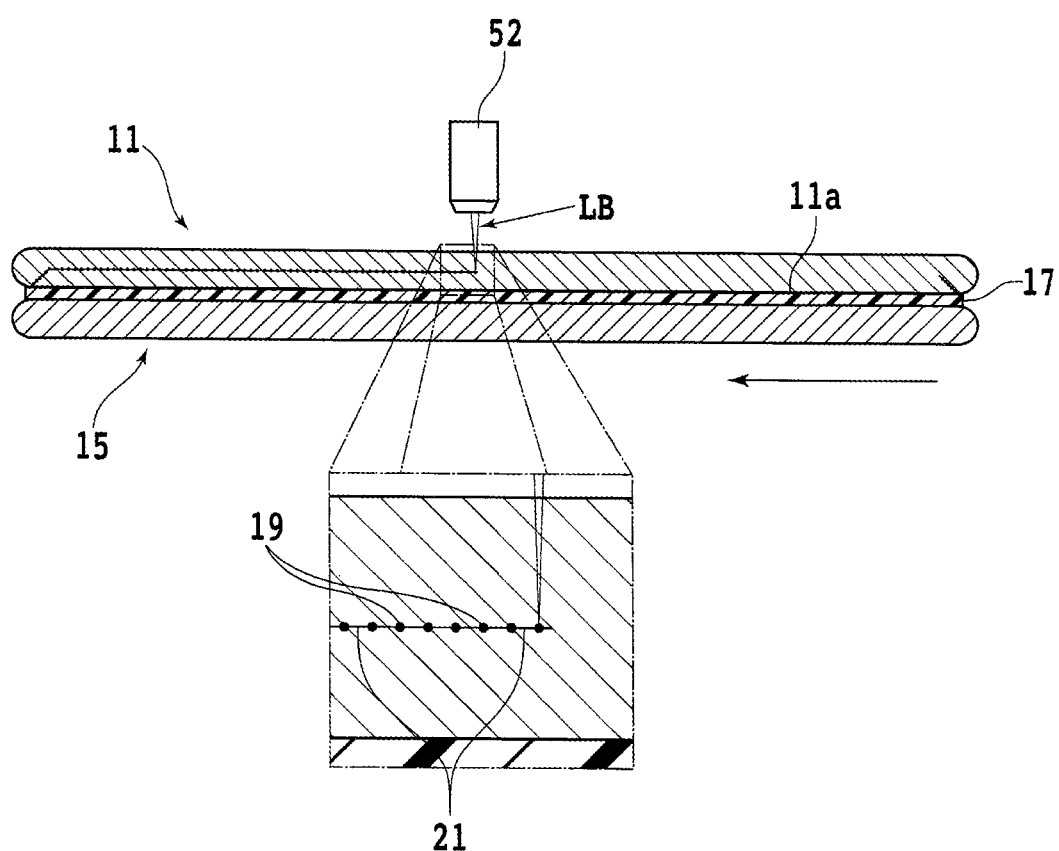
FIG. 7 is a cross-sectional view schematically illustrating a manner in which laser beam is applied to a region of the wafer that is positioned radially inwardly of a first peel-off layer.

FIG. 7 schematically illustrates in cross section the manner in which the laser beam LB is applied to the region of the wafer 11 that is positioned radially inwardly of the first peel-off layer. In FIG. 7, the laser beam LB forms a plurality of, e.g., a range from two to ten, focused spots that are spaced at equal intervals, e.g., ranging from 5 to 15 µm, in the wafer 11 in a direction perpendicular to the Z-axis directions, i.e., a direction normal to the sheet of FIG. 7, for example.

Then, while the laser beam applying unit 42 is being energized, the horizontal moving mechanism 6 is actuated to move the holding table 26 that is holding the laminated wafer thereon. For example, in a case where the laser beam LB is branched in such a manner that the branched laser beam LB will form a plurality of focused spots in the wafer 11 that are arrayed at equal intervals in the X-axis directions, the horizontal moving mechanism 6 is actuated to move the holding table 26 in one of the Y-axis directions at a time.

In this manner, a peel-off layer is formed in the wafer 11 in a straight region that is positioned radially inwardly of the first peel-off layer, the peel-off layer including a plurality of modified areas 19 and cracks 21 extending from each of the modified areas 19. Then, the laser beam applying unit 42 stops being actuated.

Thereafter, the horizontal moving mechanism 6 is actuated to move the holding table 26 in a direction perpendicular to the straight region in the wafer 11 where the peel-off layer has already been formed. Specifically, in a case where the laser beam LB is branched in such a manner that the branched laser beam LB will form a plurality of focused spots in the wafer 11 that are arrayed at equal intervals in the X-axis directions, the horizontal moving mechanism 6 is actuated to move the holding table 26 in one of the X-axis directions at a time.

Then, the laser beam applying unit 42 is energized and the horizontal moving mechanism 6 is actuated to form a peel-off layer in the wafer 11 in a straight region parallel to the straight region in the wafer 11 where the peel-off layer has already been formed. The above process is repeated until peel-off layers are formed in the wafer 11 from an end region of the wafer 11 that is positioned radially inwardly of the first peel-off layer to an opposite end region of the wafer 11 that is positioned radially inwardly of the first peel-off layer.

As a result, a peel-off layer, i.e., a second peel-off layer, is formed in the wafer 11 in such a manner as to extend along the upper bottom surface of the truncated cone referred to above in the region positioned radially inwardly of the first peel-off layer. Now, the first peel-off layer forming step S2 and the second peel-off layer forming step S3 are completed.

According to the method illustrated in FIG. 2, after the first peel-off layer forming step S2 and the second peel-off layer forming step S3, external forces are exerted on the wafer 11 in one of the thicknesswise directions of the wafer 11, thereby dividing the wafer 11 along the first peel-off layer and the second peel-off layer that function as division initiating points (dividing step S4).

Figure 8:
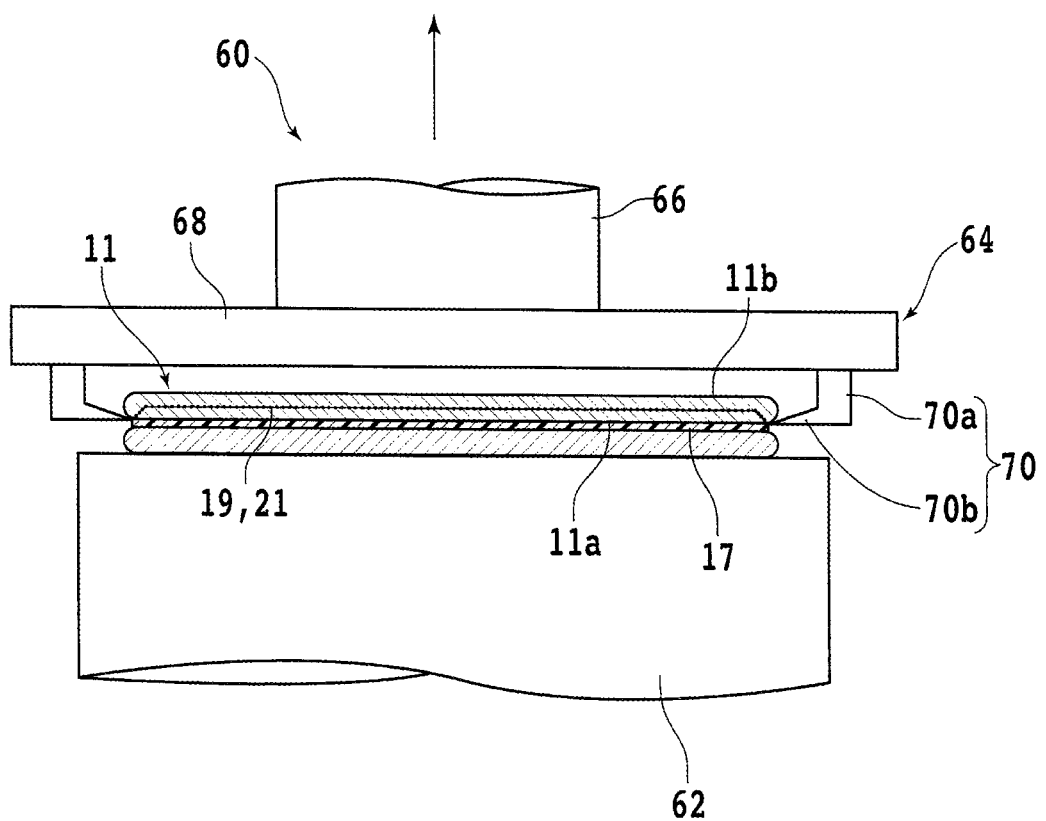
FIG. 8 is a side-elevational view, partly in cross section, schematically illustrating a manner in which the wafer is divided.

FIG. 8 schematically illustrates in side elevation, partly in cross section, the manner in which the wafer 11 is divided. The dividing step S4 is carried out using a dividing apparatus 60 illustrated in FIG. 8. As illustrated in FIG. 8, the dividing apparatus 60 has a holding table 62 for holding thereon the laminated wafer including the wafer 11 in which the first peel-off layer and the second peel-off layer have been formed.

The holding table 62 has a circular upper surface as a holding surface. A porous plate, not illustrated, is exposed on the holding surface. The porous plate communicates with a suction source, not illustrated, such as a vacuum pump through a fluid channel or the like, not illustrated, defined in the holding table 62. When the suction source is actuated, it generates a negative pressure that is transmitted through the fluid channel to a space near the holding surface.

The dividing apparatus 60 also includes a dividing unit 64 disposed above the holding table 62. The dividing unit 64 has a cylindrical support rod 66 whose upper portion is coupled to a ball-screw-type lifting and lowering mechanism, not illustrated, for example. When the ball-screw-type lifting and lowering mechanism is actuated, it selectively lifts and lowers the dividing unit 64.

The support rod 66 has a lower end fixed centrally to an upper portion of a disk-shaped grip claw base 68. A plurality of grip claws 70 that are spaced at generally equal intervals circumferentially around the grip claw base 68 are mounted on a lower surface of an outer circumferential region of the grip claw base 68. The grip claws 70 have respective plate-shaped vertical bars 70a extending downwardly.

The vertical bars 70a have respective upper end portions coupled to an actuator such as an air cylinder housed in the grip claw base 68. When the actuator is operated, it moves the grip claws 70 radially inwardly or outwardly of the grip claw base 68. The grip claws 70 also have respective plate-shaped claw points 70b extending from respective inner side surfaces of lower ends of the vertical bars 70a toward the center of the grip claw base 68. The claw points 70b are progressively thinner toward the center of the grip claw base 68.

The dividing apparatus 60 carries out the dividing step S4 according to the following sequence, for example. First, the laminated wafer is placed on the holding table 62 in such a manner that the center of the reverse side 15b of the support wafer 15 of the laminated wafer that includes the wafer 11 where the first peel-off layer and the second peel-off layer have been formed and the center of the holding surface of the holding table 62 are aligned with each other.

Then, the suction source communicated with the porous plate exposed on the holding surface is actuated to hold the laminated wafer under suction on the holding table 62. Next, the actuator housed in the grip claw base 68 is operated to position the grip claws 70 radially outwardly of the grip claw base 68.

Then, the lifting and lowering mechanism is actuated to position tips of the claw points 70b of the respective grip claws 70 at the same height as the adhesive 17 of the laminated wafer. Next, the actuator in the grip claw base 68 is operated to bring the claw points 70b radially inwardly into contact with the laminated wafer. Thereafter, the lifting and lowering mechanism is actuated to lift the claw points 70b.

The claw points 70b as they are lifted exert upward external forces to the outer circumferential region of the wafer 11, i.e., external forces along one of the thicknesswise directions of the wafer 11. Under the external forces thus exerted, the cracks 21 included in the first peel-off layer and/or the second peel-off layer are developed, separating the wafer 11 into two parts, i.e., a part belonging to the face side 11a, i.e., a lower surface of the wafer 11, and a part belonging to the reverse side 11b, i.e., an upper surface of the wafer 11.

According to the method illustrated in FIG. 2, a first peel-off layer extending along a side surface of a truncated cone that has a lower bottom surface positioned near the face side 11a of the wafer 11 and an upper bottom surface positioned within the wafer 11, and a second peel-off layer extending along the upper bottom surface of the truncated cone are formed in the wafer 11. Then, according to the method, external forces are exerted on the wafer 11 in one of the thicknesswise directions thereof, thereby dividing the wafer 11 along the first peel-off layer and the second peel-off layer that function as division initiating points.

In the wafer 11, the first peel-off layer is formed along the side surface of the truncated cone. When the wafer 11 is divided, the probability that a side surface of the region where the devices are formed, i.e., the device region, that is newly exposed by dividing the wafer 11 along the first peel-off layer and an inner side surface of the outer circumferential region of the wafer 11 will contact each other is low. According to the method illustrated in FIG. 2, therefore, the probability that cracks will be developed toward the devices 13 formed on the face side of the device region is also low, preventing the devices 13 from being damaged.

In the wafer 11, furthermore, cracks tend to be developed in directions from the first peel-off layer along the side surface of the truncated cone. In this case, the probability that cracks will be developed toward the devices 13 formed on the face side of the device region is low. According to the method illustrated in FIG. 2, therefore, the number of chips that can be fabricated from the wafer 11 is prevented from being reduced.

The method of processing a wafer as described above represents an aspect of the present invention, and the present invention is not limited to the above method. According to the present invention, for example, after the first peel-off layer and the second peel-off layer have been formed in the wafer 11, the face side 11a of the wafer 11 may be affixed to the face side 15a of the support wafer 15. According to the present invention, in other words, the affixing step S1 may be carried out after the first peel-off layer forming step S2 and the second peel-off layer forming step S3.

According to the present invention, moreover, the first peel-off layer forming step S2 and the second peel-off layer forming step S3 may be carried out in any sequence. According to the present invention, in other words, the first peel-off layer forming step S2 may be carried out after the second peel-off layer forming step S3 has been carried out.

According to the present invention, in the first peel-off layer forming step S2, it is sufficient if a peel-off layer is formed in the wafer 11 in such a manner as to extend along a side surface of a truncated cone that has a lower bottom surface positioned near the face side 11a of the wafer 11 and an upper bottom surface positioned within the wafer 11. The present invention is not limited to any process of forming such a peel-off layer.

According to the present invention, in the first peel-off layer forming step S2, for example, the laser beam LB may be applied to the wafer 11 while the horizontal moving mechanism 6 and the vertical moving mechanism 32 are being actuated in addition to or instead of the rotary actuator coupled to the lower portion of the table base 24. In other words, the laser beam LB may be applied to the wafer 11 while not only the wafer 11 is being rotated, but also the coordinates of the focused spots of the laser beam LB in the XY coordinate plane and the heights of the focused spots are being changed.

In this case, furthermore, a laser beam LB that is not branched may be used. Stated otherwise, even when a laser beam LB that forms a single focused spot is used, a peel-off layer extending along a side surface of a truncated cone may be formed in the wafer 11 by applying the laser beam LB to the wafer 11 while the wafer 11 is being rotated and the coordinates in the XY coordinate plane and the height of the focused point are being changed.

According to the present invention, in the first peel-off layer forming step S2, the laser beam LB may be applied to the wafer 11 in a plurality of cycles in such a manner that their focused spots are positioned at identical or close locations. In this case, the modified areas 19 included in the produced peel-off layer become larger in size, and the cracks 21 included in the produced peel-off layer are extended further. Consequently, the wafer 11 can be divided more easily in the dividing step S4.

According to the present invention, in the first peel-off layer forming step S2, the laser beam LB may be applied to the wafer 11 in such a manner that adjacent ones of the modified areas 19 are not interconnected by cracks 21 but interconnected directly. In this case, since the shape of the peel-off layer can be determined independently of the shape of the cracks 21 extending from the modified areas 19, the wafer 11 can be processed stably.

According to the present invention, in the second peel-off layer forming step S3, it is sufficient if a peel-off layer is formed in such a manner as to extend along the upper bottom surface of the truncated cone referred to above. The present invention is not limited to any process of forming such a peel-off layer. According to the present invention, in the second peel-off layer forming step S3, for example, a laser beam LB that is not branched may be used.

According to the present invention, in the second peel-off layer forming step S3, the laser beam LB may be applied to the wafer 11 while the rotary actuator coupled to the lower portion of the table base 24 is being energized in addition to or instead of the horizontal moving mechanism 6. In other words, the laser beam LB may be applied in an annular pattern to the wafer 11 in the region positioned radially inwardly of the first peel-off layer.

According to the present invention, in the second peel-off layer forming step S3, as with the first peel-off layer forming step S2, the laser beam LB may be applied to the wafer 11 in a plurality of cycles in such a manner that their focused spots are positioned at identical or close locations. Moreover, the laser beam LB may be applied to the wafer 11 in such a manner that adjacent ones of the modified areas 19 are not interconnected by cracks 21 but interconnected directly.

According to the present invention, in the dividing step S4, ultrasonic waves may be applied to the wafer 11 prior to the dividing of the wafer 11 in which the first peel-off layer and the second peel-off layer have been formed. In this case, inasmuch as the cracks 21 included in the first peel-off layer and the second peel-off layer are developed, the wafer 11 can be divided more easily.

In a case where it is possible to develop the cracks 21 in the dividing step S4, the first peel-off layer and the second peel-off layer may not be connected to each other. For example, the second peel-off layer may be formed in the wafer 11 at a position slightly farther from or closer to the face side 11a of the wafer 11 than the upper bottom surface of the truncated cone referred to above. Similarly, the second peel-off layer may be formed in a disk-shaped region that is smaller in diameter than the upper bottom surface of the truncated cone.

The structure, method, etc. according to the above embodiment may be changed or modified appropriately without departing from the scope of the present invention.

The present invention is not limited to the details of the above described preferred embodiment. The scope of the invention is defined by the appended claims and all changes and modifications as fall within the equivalence of the scope of the claims are therefore to be embraced by the invention.

What is claimed is:

1. A method of processing a first wafer having a plurality of devices formed on a face side thereof and a beveled outer circumferential region, by applying a laser beam to the first wafer to form a peel-off layer in the first wafer and thereafter dividing the first wafer along the peel-off layer that functions as a division initiating point, the method comprising:

an affixing step of affixing the face side of the first wafer to a face side of a second wafer;

a first peel-off layer forming step of applying the laser beam to a region of the first wafer that is positioned radially inwardly of the outer circumferential region of the first wafer, in such a manner that a focused spot of the laser beam is progressively closer to the face side of the first wafer as the focused spot is progressively closer to the outer circumferential region, thereby forming a first peel-off layer in the first wafer that extends along a side surface of a truncated cone having a first bottom surface positioned near the face side of the first wafer and a second bottom surface positioned within the first wafer and smaller in diameter than the first bottom surface;

a second peel-off layer forming step of applying the laser beam to a region of the first wafer that is positioned radially inwardly of the first peel-off layer while the focused spot of the laser beam is being positioned on the second bottom surface of the truncated cone, thereby forming a second peel-off layer in the first wafer that extends along the second bottom surface of the truncated cone; and a dividing step of, after the affixing step, the first peel-off layer forming step, and the second peel-off layer forming step, exerting external forces on the first wafer thicknesswise of the first wafer to divide the first wafer along the first peel-off layer and the second peel-off layer that function as division initiating points.

2. The method according to claim 1, wherein the first peel-off layer forming step is carried out before the second peel-off layer forming step.

3. The method according to claim 2, wherein the laser beam is branched in the first peel-off layer forming step so as to form a plurality of focused spots arrayed radially of the first wafer as viewed in plan.

4. The method according to claim 1, wherein the laser beam is branched in the first peel-off layer forming step so as to form a plurality of focused spots arrayed radially of the first wafer as viewed in plan.

* * * * *